US008102170B2

(12) United States Patent
Monti

(10) Patent No.: US 8,102,170 B2
(45) Date of Patent: Jan. 24, 2012

(54) METHOD FOR COUNTING AND VALIDATING ARTICLES, IN PARTICULAR PHARMACEUTICAL ARTICLES, AND AN APPARATUS FOR ACTUATING THE METHOD

(75) Inventor: Giuseppe Monti, Pianoro (IT)

(73) Assignee: Marchesini Group S.p.A., Pianoro (IT)

( * ) Notice: Subject to any disclaimer, the term of this patent is extended or adjusted under 35 U.S.C. 154(b) by 729 days.

(21) Appl. No.: 12/246,592

(22) Filed: Oct. 7, 2008

(65) Prior Publication Data

US 2009/0090659 A1 Apr. 9, 2009

(30) Foreign Application Priority Data

Oct. 8, 2007 (IT) .............................. BO2007A0677

(51) Int. Cl.
*G01N 27/00* (2006.01)
*G01R 27/26* (2006.01)

(52) U.S. Cl. ........ 324/71.4; 324/663; 324/679; 324/686

(58) Field of Classification Search .................. 324/663, 324/686, 71.4, 679
See application file for complete search history.

(56) References Cited

U.S. PATENT DOCUMENTS

| | | | | |
|---|---|---|---|---|
| 6,363,687 | B1 | 4/2002 | Luciano et al. | |
| 7,655,945 | B2 * | 2/2010 | Pui et al. | 257/48 |

FOREIGN PATENT DOCUMENTS

| | | | |
|---|---|---|---|
| WO | WO9604171 A | 2/1996 |
| WO | WO9540498 A | 3/1997 |
| WO | 2008098340 A | 8/2008 |

OTHER PUBLICATIONS

International Search Report.

* cited by examiner

*Primary Examiner* — Amy He
(74) *Attorney, Agent, or Firm* — William J. Sapone; Coleman Sudol Sapone P.C.

(57) ABSTRACT

A method for counting and validating discrete articles to be introduced into containers, and an apparatus for actuating the method, which method includes distancing the articles from one another in a thinning-out section, and making the articles cross a detection zone such as to induce a consequent reactance variation in at least a variable reactance sensor. According to a reactance variation, an output signal of the variable reactance sensor takes on a specific waveform, the output signal being sent to an input of a processing unit. The processing unit provides in output data relating to a number of the articles which have passed through the at least a detection zone, a wholeness thereof as well as a passage of objects of a different nature from the articles into the detection zone.

9 Claims, 8 Drawing Sheets

FIG. 3B
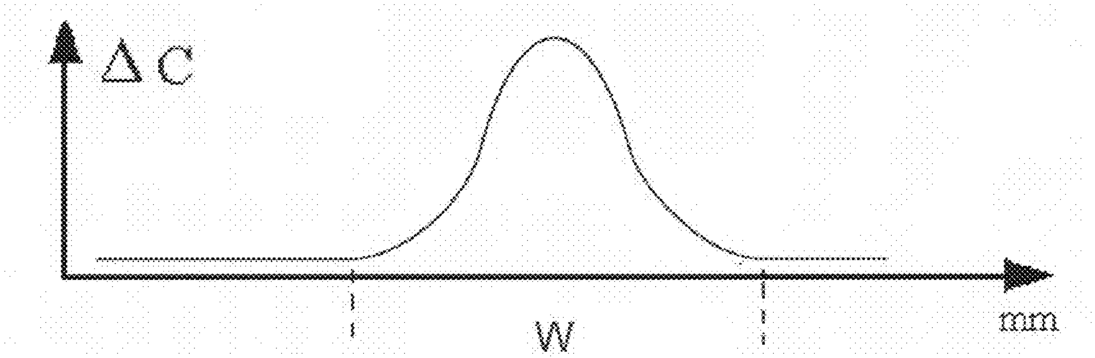
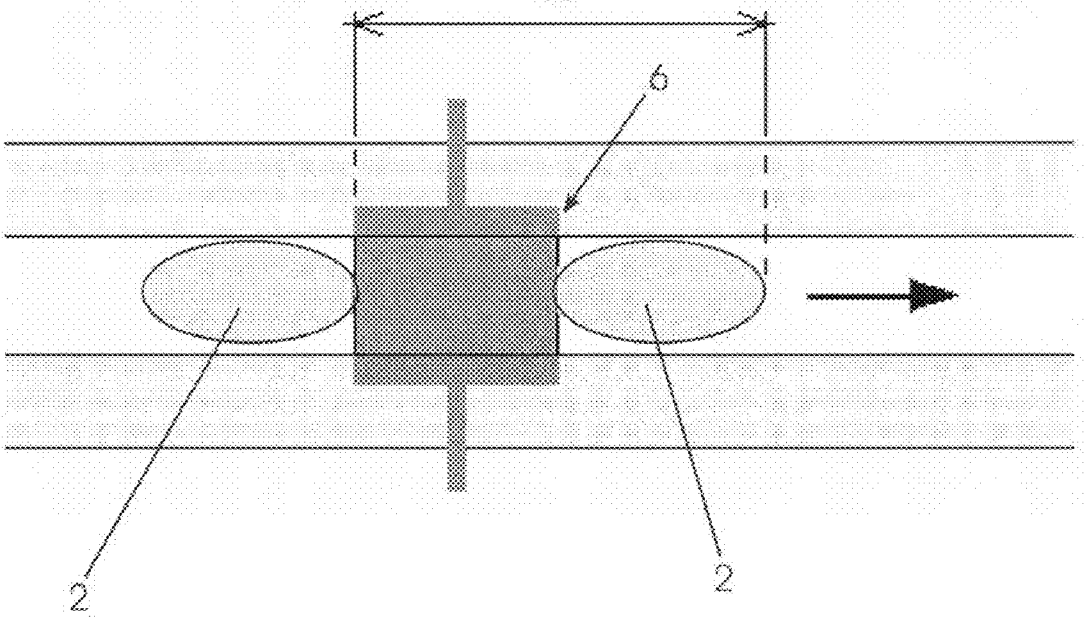
FIG. 3A

FIG. 5A
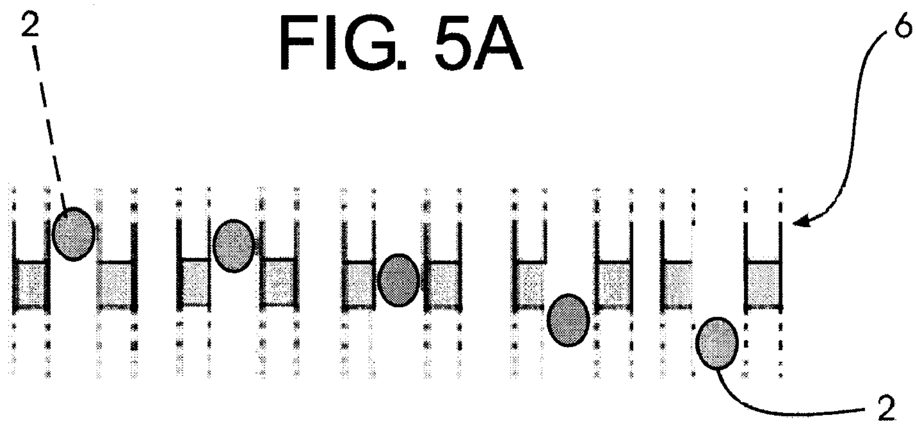
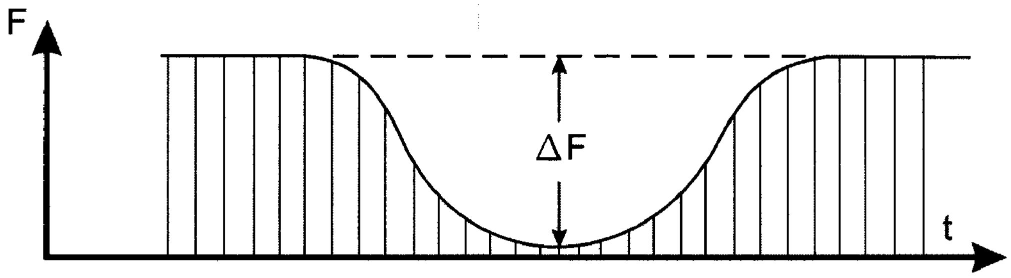
FIG. 5B

| Co (fF) | T1 | | | T2 | | | T3 | | | Constructive notes LXH, D (mm) |
|---|---|---|---|---|---|---|---|---|---|---|
| | Cp (fF) | ΔC (fF) | ΔC/Co | Cp (fF) | ΔC (fF) | ΔC/Co | Cp (fF) | ΔC (fF) | ΔC/Co | |
| 612,2 | 643,3 | 31,1 | 5,1% | | | | | | | 8x8, 3 |
| 618,6 | 649,7 | 31,1 | 5,0% | | | | | | | 10x8, 1 |
| 529,7 | 558,6 | 28,9 | 5,5% | | | | | | | 8x8, 1 |
| 434,9 | 457,6 | 22,7 | 5,2% | | | | | | | 6x8, 1 |
| 280 | 287,4 | 7,4 | 2,6% | | | | | | | 10x3, 5 |
| 136,1 | 141 | 4,9 | 3,6% | | | | | | | 5x3, 5 |
| 282,5 | 297,4 | 14,9 | 5,3% | | | | | | | 6x4.24, 2 |
| 215,4 | 225,1 | 9,7 | 4,5% | | | | | | | 1.5x10, 2 |
| 426,3 | 444,7 | 18,4 | 4,3% | | | | | | | 6x14, 3 |
| 353,7 | 369,2 | 15,5 | 4,4% | | | | | | | 4x14, 3 |
| 309,9 | 331,9 | 22 | 7,1% | | | | | | | 6x5, 1 |
| 281,9 | 302,7 | 20,8 | 7,4% | | | | | | | 5x4, 1 |
| 228,3 | 246 | 17,7 | 7,8% | | | | | | | 5x3, 1 |
| 219 | 228,7 | 9,7 | 4,4% | | | | | | | 5x2, 1 |
| 220 | 238,9 | 18,9 | 8,6% | 250,2 | 30,2 | 13,73% | 238,4 | 18,4 | 8,36% | 4x3, 1 |
| 184,7 | 199,7 | 15 | 8,1% | | | | | | | 3x3, 1 |
| 188,9 | 204,1 | 15,2 | 8,0% | 213,3 | 24,4 | 12,92% | 213,5 | 24,6 | 13,02% | 4x3, 1.5 |
| 179 | 189,7 | 10,7 | 6,0% | 209,3 | 30,3 | 16,93% | 198,5 | 19,5 | 10,89% | 4x3, 2 |
| 203,8 | 218,7 | 14,9 | 7,3% | | | | | | | 4x4, 2 |
| 224,6 | 241,4 | 16,8 | 7,5% | 266 | 41,4 | 18,43% | 250 | 25,4 | 11,31% | 4x5, 2 |
| 249,5 | 267,5 | 18 | 7,2% | | | | | | | 4x6, 2 |

METHOD FOR COUNTING AND VALIDATING ARTICLES, IN PARTICULAR PHARMACEUTICAL ARTICLES, AND AN APPARATUS FOR ACTUATING THE METHOD

BACKGROUND OF THE INVENTION

The invention relates to the technical sector of article counting and validating machines, in particular pharmaceutical articles, such as, though not limited to, lozenges, pills, tablets, capsules, pastilles or similar products.

In particular, the present invention relates to a method for counting and validating articles and an apparatus for actuating the method.

Various type of medicines are marketed, contained in bottles, with the aim of maintaining the integrity and preserving the sterility thereof, the filling of which is realized by special automated machines. Should the medicines be in the form of discrete articles and thus not in liquid or gassy form such as syrups or aerosols, the problem of having to count them arises, in order to control the quantity introduced into the respective bottles, and make sure the articles are singly whole.

The critical aspect of this problem is obvious on considering that the adoption of automated machines has the aim of rendering the above-described filling process not only more efficient but especially faster.

Typically, machines for filling the bottles with pharmaceutical articles comprise feeders constituted by linear vibrators which transport the articles towards a filling station, comprised in the machine, in which the bottles the pharmaceutical articles are destined for are located.

These feeders can be, for example, conformed such as to exhibit a multiplicity of conveying grooves, each having a substantially V-shaped transversal section for housing the loose articles, which advance along the grooves without piling up, thanks to the linear vibration.

It is clear that a section of the machine that is at the same time downstream of the feeder and immediately upstream of or positioned at the filling section is the best location for an article counting and validation device.

A known method for counting and validating single pharmaceutical articles to be sold in bottles and a device for performing the task are described in patent document EP 1251073.

In this method the articles borne by the feeders, once having reached the filling section, are left to fall by force of gravity, for subsequent introduction into the bottles. The articles, not being piled one on another, fall one at a time; this means that each of them, thanks to the acceleration impressed on them by the force of gravity, is distanced from the next at the moment of dropping.

A TV camera is located downstream of the feeder, at a certain point in the trajectory of the fall, and in proximity of the articles.

The camera is associated to a control unit, which has the function of comparing the profile of each falling article framed by the camera, with the profile provided to the camera as an example of a whole article. If the control unit detects, on a profile of one of the falling articles, a difference with respect to the whole article defined as meaningful on the basis of given parameters, the article is defined as non-whole.

The stage of comparison is made possible by a distancing between the falling articles, as mentioned above.

Before the articles enter the bottle, and in a zone of the machine which is upstream of the bottles themselves, the articles are counted by special optical sensor organs, such as for example photovoltaic cells, a functioning of which is assumed to be known.

An effective validation of the articles in the prior art can be done only by obtaining a considerable optical contrast between the articles themselves and that which constitutes the background in the frame captured by the camera.

Given the velocity at which the bottles have to be filled, in order to obtain good machine performance, the only adjustments possible for improving the contrast are:

- placing a special contrast surface, for example for achieving a chromatic contrast with the articles to be validated, in an position (in relation to the camera) opposite the fall trajectory, and
- using light sources for illuminating the fall trajectory, at the same height as the camera, positioning side-lighting with respect to the contrast surface, such that the shadows of the falling articles project thereon.

With these adjustments, there is a discontinuity between the luminosity of the article to be validated and the luminosity of the contrast surface, and this is accentuated around the edge of the profile thereof, which from the point of observation of the camera appears to be at least partly surrounded by shadows.

From the above description it can be seen that the solution of the prior art can be effective in counting completely opaque pharmaceutical articles and in obtaining a correct validation but, since only an optical technology is used, it cannot in any way achieve the technical aims of counting and validating pharmaceutical articles which are entirely or partly translucent or transparent (a representative example is that of drugs contained in a gelatin capsule).

A second considerable limitation which hinders the efficacy of the above-described solution consists in the fact that it does not make available any means or process which can prevent an object of a different nature from those of the specific pharmaceutical articles from reaching a bottle. By way of example, though not exhaustive, reference is made to a case of a pharmaceutical product which is inadvertently arranged on the conveyor groove of the feeder in which other specific pharmaceutical articles are arranged, destined for specific bottles, exhibiting the same shape, for example because they are contained in a same type of capsule but having a totally different formula. The dangers correlated to an eventuality of this type are, as will be anticipated, of considerable entity; let it suffice to think of what risks a person runs when unknowingly ingesting a pharmaceutical product comprising an active ingredient which is totally different from that of the prescribed medicine.

SUMMARY OF THE INVENTION

The above-described drawbacks and others besides are obviated by a method, as described in claim 1, for counting and validating discrete articles destined to be introduced into containers and by an apparatus for actuating the method, as described in claim 6, for counting and validating the discrete articles, especially pharmaceutical articles destined to be introduced in the container, in particular bottles.

The method comprises the following stages:

a. distancing the articles from one another;

b. making each article pass through at least a detection zone such as to induce a consequent reactance variation in at least a variable reactance sensor, according to which variation, an output signal of the sensor takes on a specific waveform c. sending the output signal from the variable reactance sensor to the input of a processing unit;

d. providing, in output from the processing unit, data relating to the number of discrete articles which have passed through the detection zone, the wholeness thereof and the passage into the detection zone of objects of a different nature from the articles themselves.

The apparatus comprises:

a thinning-out section which receives the articles from feeding means, which section distances the articles from one another and causes each article to cross at least a detection zone, which involves electronic components comprised in the variable reactance sensor, a reactance of which changes according to the specific articles which pass there-through, and a processing unit, connected to the variable reactance sensor and receiving in input the signal in output from the variable reactance sensor and analyze a waveform thereof, which waveform is a function of the reactance variation, such that the processing unit provides, in output, data relating to the number of articles which have passed through the detecting zone, the wholeness of the articles and the crossing of the detection zone on the part of objects of a different nature to that of the articles.

As the method and apparatus of the present invention include each discrete pharmaceutical article to be introduced in the respective bottle alters the sensor's reactance, the count and validation of the articles is obtained simply and reliably by detecting and processing not only how many times the alteration occurs, but also the type and degree of the alteration (by means of special details, a preferred embodiment of which will be better explained herein below).

Consequently, the proposed technical solution enables, on the contrary to the prior art, counting and validating discrete pharmaceutical articles destined for introduction into bottles, independently of the fact that they are opaque, translucent or transparent, since the invention does not use methods or means of an optical nature for realizing the technical aims.

Further, as mentioned, in the method of the invention, the stages of which are actuated in specific aspects of the apparatus, detection is made when and if objects of a different nature to that of the articles to be counted and validated pass through the detection zone, thus preventing the risk that these might fall into the bottles to which the articles are destined. Herein below a more detailed description will be made of which details are preferably included in the present invention in order to reach the advantageous above-described technical aim.

Before the above-mentioned stages a, b, c, and d, the apparatus has to undergo a self-learning process which actuates the method of the invention; in detail, at first stages a', b' and c' are performed, which respectively correspond to performance of stages a, b and c applied to a predetermined multiplicity of sample objects, such as whole articles, variously non-whole articles and objects of a different nature from the articles themselves.

Before or after performing stages a', b' and c', the processing unit is programmed such that once all the signals relating to each sample object have been received, the processing unit subdivides the respective waveforms into classes on the basis of a predetermined similarity function, by associating the articles to the classes, to which stages a, b, c and d are successively applied, in order to qualify the articles either as whole articles or non-whole articles, or objects of a different nature to that of the articles registered.

As the above makes clear, the invention provides a method and a relative apparatus for counting and validating pharmaceutical articles destined to be introduced into bottles, destined also to be applied to machines for filling the bottles designed to fill with the very best performance possible; the counting and validation are done without interrupting the flow of articles from the feeder to the bottles, without intervening mechanically on the flow and, especially, without slowing the flow due to technological limitations such as those imposed by the maximization of the optical contrast in the solution of the prior art.

Further, the user of a machine for filling the bottles with pharmaceutical products in which the present method and apparatus have been used can provide, for each filled bottle, not only a certification of the fact that the bottle contains the correct and predetermined number of pharmaceutical articles and that they are all perfectly whole, but also, and advantageously, that no bottle has received any object of a different nature to the correct articles.

BRIEF DESCRIPTION OF THE DRAWINGS

The characteristics of the invention which do not emerge from the above will be better detailed in the following, according to what is set out in the claims and with the aid of the accompanying figures of the drawings, in which:

FIG. 3A schematically illustrates a portion of a detection zone of the apparatus;

FIG. 3B, with reference to FIG. 3A, illustrates the variation of the capacity of the capacitive sensor used by the apparatus, cause by the transit of an article through the detection zone;

FIG. 5A is the illustration of FIG. 3A in considerably more detail, while FIG. 5B is a graph illustrating, with reference to FIG. 5A, the change in frequency due to the change in capacity of the sensor shown in FIG. 3B;

DESCRIPTION OF THE PREFERRED EMBODIMENTS

Figure 1:
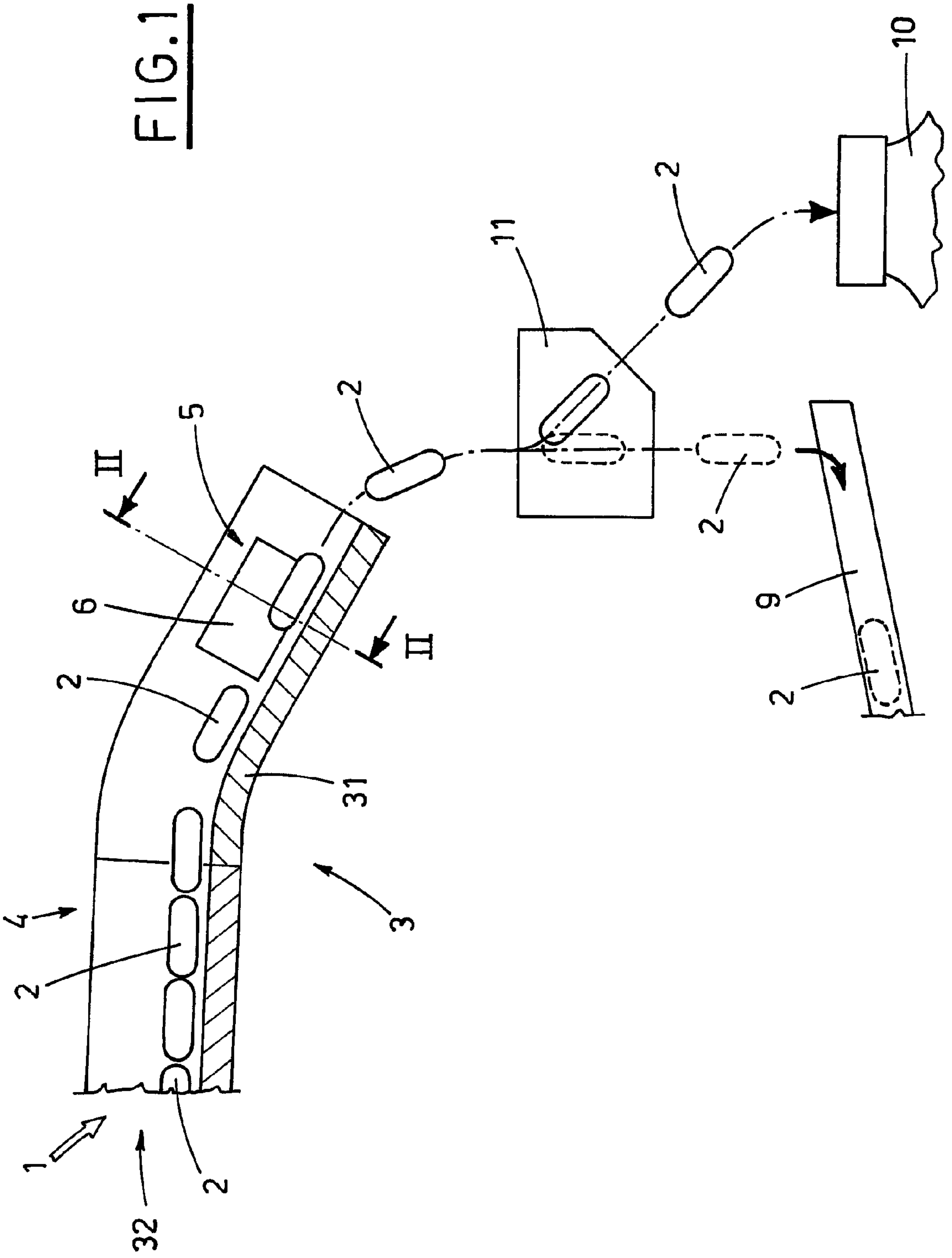
FIG. 1 is a schematic view in longitudinal section of a part of the apparatus of the invention.

With reference to the figures of the drawings, 1 denotes an apparatus for counting and validating discrete articles 2, especially pharmaceutical articles 2, destined to be introduced into container 10, especially bottles 10, comprising:

a thinning-out section 3 for receiving the articles 2 from feeding means 4, which distances the articles 2 from one another, and which makes each article 2 cross at least a detection zone 5, in which electronic components 6 comprised in at least a variable reactance sensor 7 (see FIG. 2) operate, the reactance of which varies according to the specific articles 2 which pass through it;

at least a processing unit 8 (see FIG. 2) connected to the variable reactance sensor 7 for receiving in input an output signal from the variable reactance sensor 7 and analyzing the waveform thereof, which waveform is a function of the reactance variation, in such a way that the processing unit 8 provides in output data relating to the number of articles 2 which have passed in the detection zone 5, to the wholeness of the articles 2 and to the presence of objects of a different nature to the articles 2 which have passed through the detection zone 5.

Preferably, as can clearly be seen in the figures, the variable reactance sensors 7 are capacitive sensors and the electronic components 6 are the armatures of at least a condenser; further, and again preferably, the detection zone 5 is comprised in the thinning-out section 3, which is shaped and sized such that the articles 2 cross the detection zone 5 in single file.

Note that in the accompanying tables, it is not explicitly illustrated, as it is well known to an expert in the field, that the feeding means 4 can comprise, for example, a linear vibrator which has the function of transporting the articles 2 towards the thinning-out section 3, without their piling up one on top of another.

In the illustrated example, the thinning-out section 3 comprises a non-horizontal thinning-out support 31 on which the articles 2 freely descend, as they are subject to a non-null force of gravity.

In more detail, the thinning-out support 31 comprises a multiplicity 32 of grooves conformed such as to have a V-shaped transversal section (see FIG. 2), the surface of a concavity of which is covered by an electrically insulating material, of any type as long as it is suited to the aim and not illustrated inasmuch as it is obvious.

As illustrated in FIG. 1, the detection zones 5 are located in a specific position along the grooves and are laterally defined by the condenser 6 armatures.

The armatures 6 are not parallel to one another and are each located on a parallel plane to one of the two planes on which the surfaces defining the concavity are located; this can be realized in two different ways, as described in the following.

Figure 2:
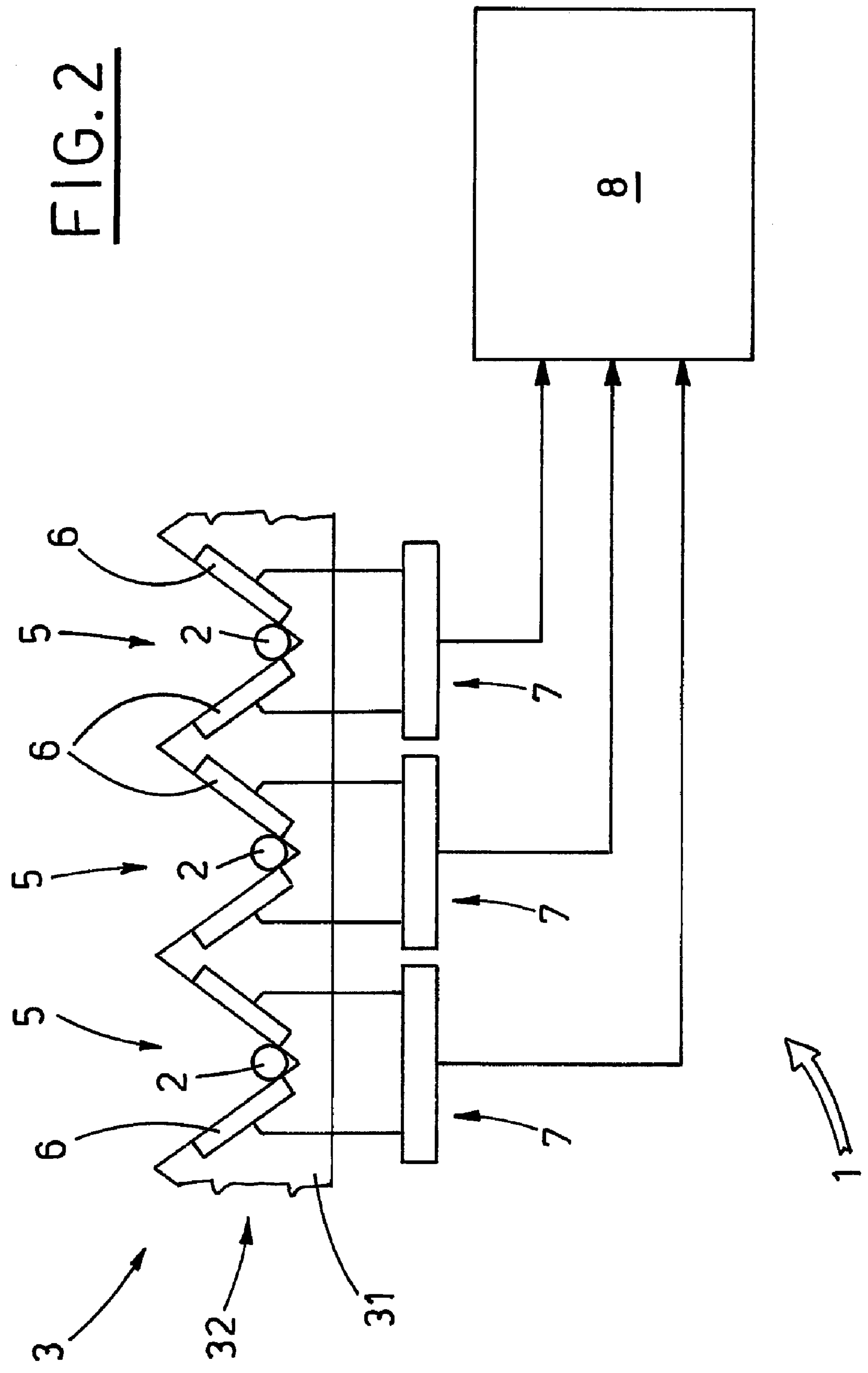
FIG. 2 is a schematic transversal section view of FIG. 1, performed along direction II-II.

The first way, represented in FIGS. 1 and 2, consists in placing the armatures 6 of the condensers on the surfaces which define the concavity of the grooves and covering them with the electrically insulating material.

The second way not illustrated as it is deducible by its difference from the first detail, consists in placing the armatures 6 of the condensers at a predetermined distance from the surfaces which define the concavity of the grooves, internally of the convex zone of the thinning-out support 31.

In a special version of the apparatus of the present invention, any longitudinal section of at least a portion of the thinning-out section 3 is flat and inclined by roughly 34° with respect to an ideal horizontal plane crossing it.

With reference to FIG. 3A, W denotes the sensitive zone comprised in each detection zone 5.

An article 2 crossing the sensitive zone W causes a variation in the dielectric constant of the dielectric interposed between the armatures of the condenser 6, with a consequent variation $\Delta C$ in the capacity thereof; this is illustrated in the graph of FIG. 3B with reference to the various positions of the article in the sensitive zone W.

Figure 4:
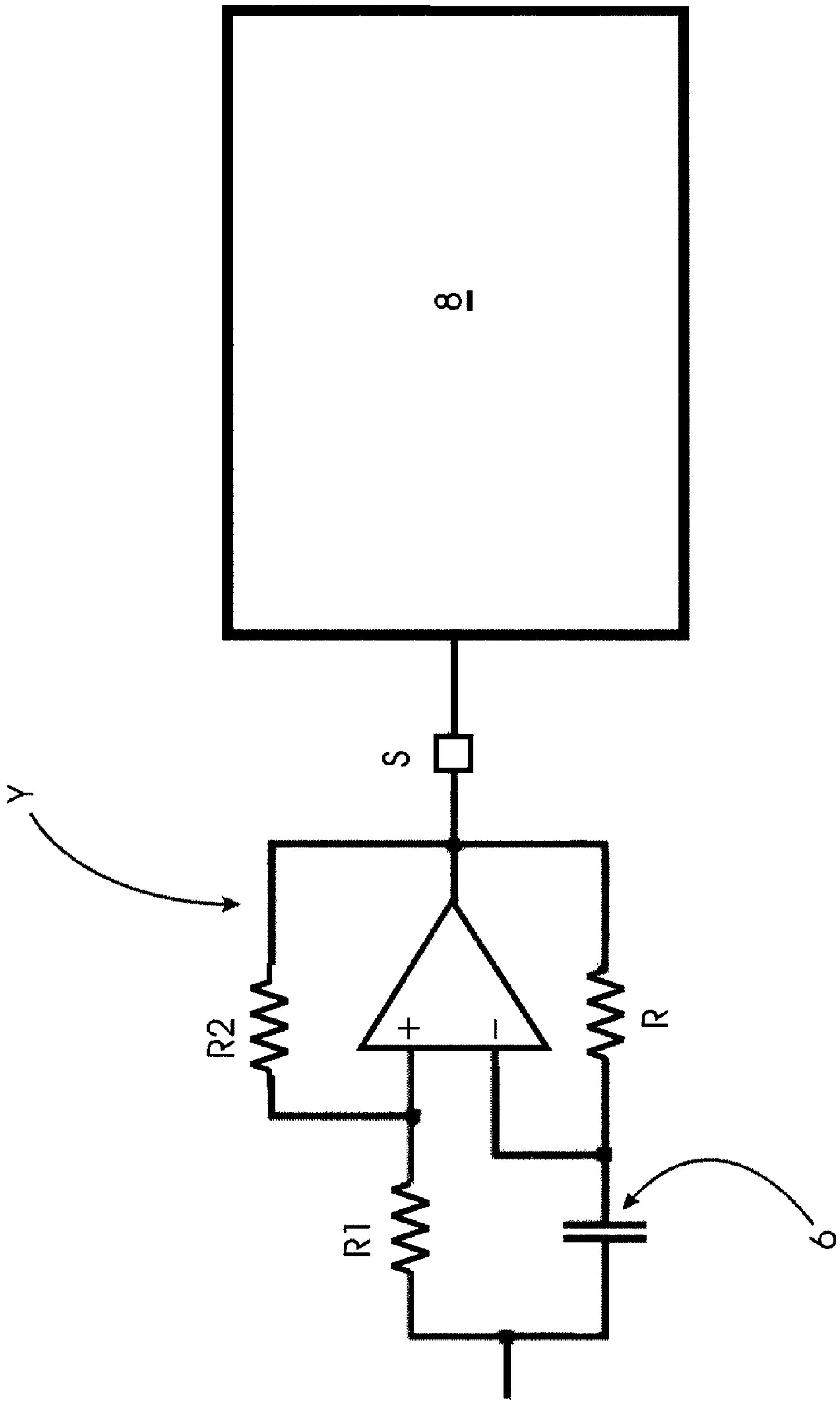
FIG. 4 is the circuit diagram of an oscillator circuit.

The condenser 6 is inserted in an oscillator circuit Y, for example the one shown in FIG. 4; it follows that the variation $\Delta C$ in the condenser 6 capacity leads to a consequent variation $\Delta F$ of the frequency of the signal S in outlet from the oscillator circuit Y; the signal is sent to the processing unit 8.

FIG. 5A illustrates various positions of an article 2 which crosses the sensitive zone; correspondingly to these positions there is the variation of the characteristic frequency of oscillation of the oscillator circuit Y, as shown in the graph of FIG. 5B.

The change of frequency is compared with a threshold counter value SC determining, or not, an advance in a counter, not shown, included in the processing unit 8; the threshold is extrapolated a priori on a statistical basis for each type of article 2, by analyzing the mean variations of frequency associated to the various formats of articles 2.

Figure 6:
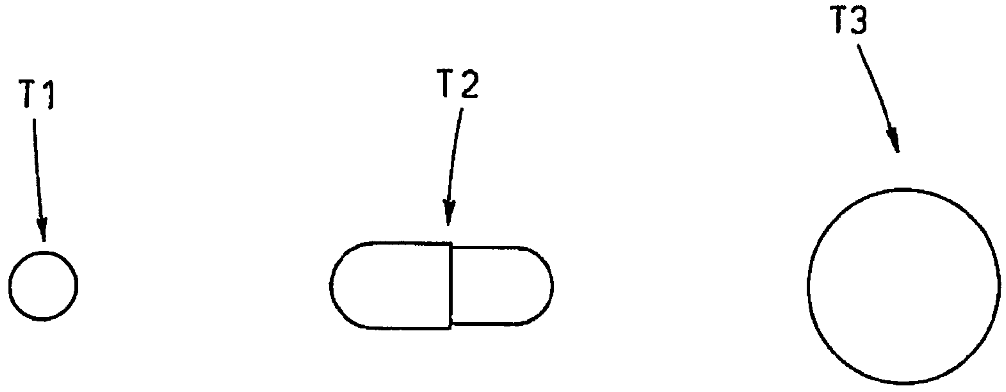
FIG. 6 shows some types of articles.
Figure 7:
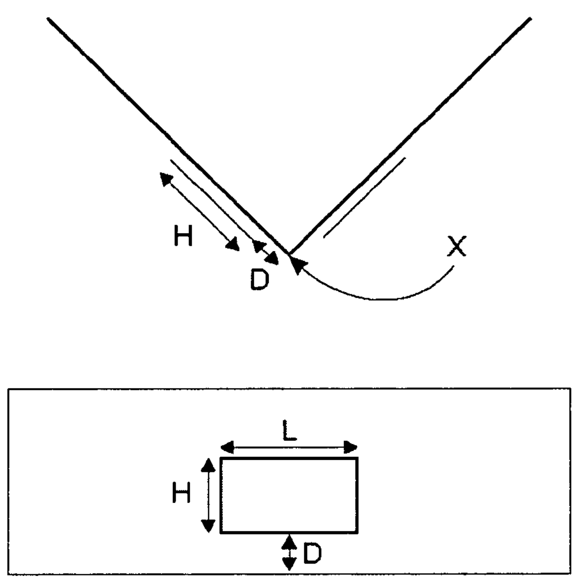
FIG. 7 is a table reporting experimental data.

With reference to the formats of the articles $T_1$ (pastilles), $T_2$ (capsules), $T_3$ (pastilles) illustrated in FIG. 6, the Applicant has performed various experiments using various geometries of the capacitive sensor, and more precisely rectangular armatures (sides L, H), differently position (value D) with respect to the vertex X of the V-profile of the detection zone 5; see, in this regard, the inset in the table of FIG. 7. The table of FIG. 7 reports the value of capacity $C_0$ (empty) of the condenser, the value of capacity $C_p$ caused by the passage of the article, the variation of capacity $\Delta C$ in absolute value and $\Delta C/C0\%$ in percentage value, all according to the geometry of the armatures of the condenser and the positioning of the armatures with respect to the vertex X.

The armatures of the condenser of the experiments shown in the table of FIG. 7 are rectangular: experiments were carried out, especially concerning the self-learning of the apparatus actuating the present method, using armatures having regular isosceles trapezoid geometry, with the smallest side positioned in proximity of the vertex X of the detection zone 5.

The applicant has performed a multiplicity of experiments, with reference to whole articles, variously non-whole articles, and articles which are of a different nature to the predetermined ones. As for the "variously non-whole articles", experiments were made using, as samples, half-pastilles and quarters of pastilles; as for the "different to the predetermined" articles, empty capsules were used, i.e. such as capsules not containing the relative product.

Figure 8A:
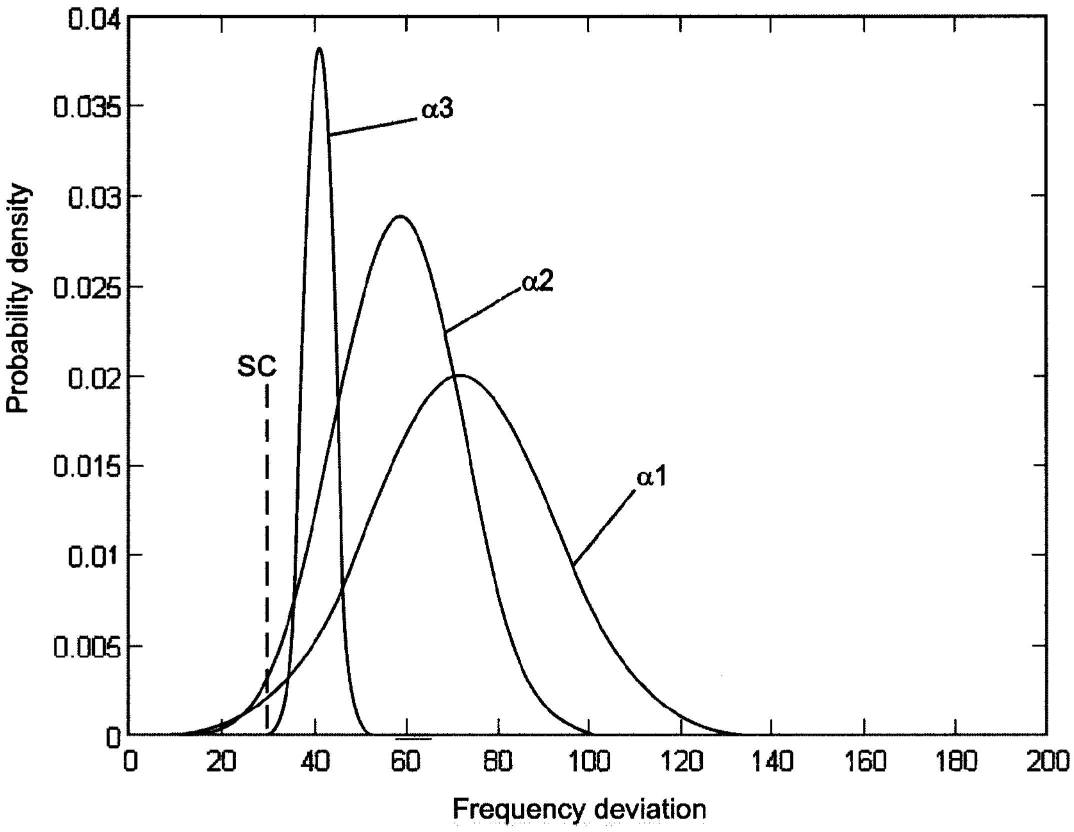
FIGS. 8A, 8B show graphs obtained following the use of samples in the process of self-learning carried out by the apparatus actuating the method of the invention.

FIG. 8A illustrates the graphs relating to the self-learning process, with samples of pastilles $T_1$ (see FIG. 6), more precisely whole pastilles (graph $\alpha$1), half-pastilles (graph $\alpha$2), and quarters of pastilles (graph $\alpha$3).

The values of the graphs, more precisely the Gaussian distributions of the variation of frequency caused, for example, by about a thousand samples, are stored in the processing unit 8 and used to actuate the present method. The deviations of frequency produced by whole, half and quarter pastilles are clearly distinguishable from one another; this means that the processing unit can detect the whole pastilles from the "variously non-whole articles" and the "different to the predetermined" ones. FIG. 8A also reports the counting threshold SC which enables the unit 8 to count any type of pastille which crosses the detection zone 5.

Figure 8B:
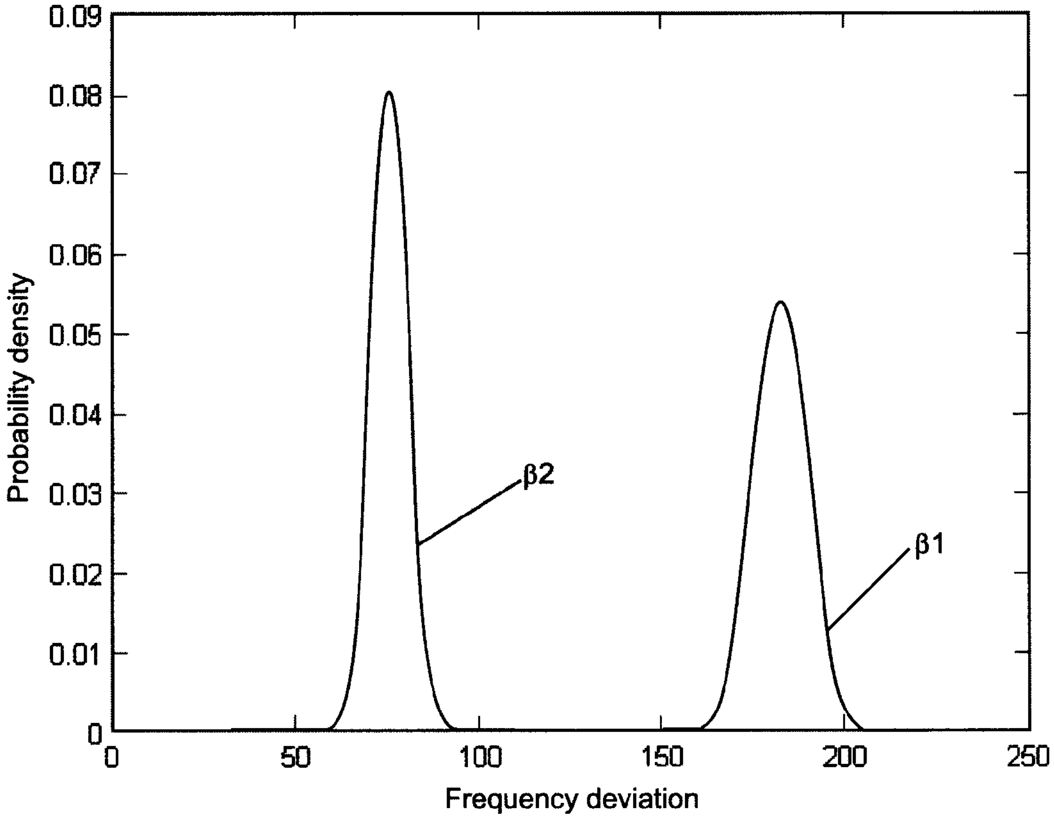

FIG. 8B includes two graphs obtained using article $T_2$ (FIG. 6): more precisely graph $\beta_1$ relates to full capsules, while graph $\beta_2$ relates to empty capsules, i.e. not containing the product.

The frequency deviations caused by full capsules and empty capsules are certainly distinguishable from each other: this enables the processing unit to detect, with certainty, full capsules from empty ones.

Clearly it would be possible to use partially-full capsules as samples such as to store, in the processing unit 8, the relative data in order to distinguish them from the full ones and therefore detect them.

With the present method and the apparatus actuating it, following the self-learning process, whole articles can be distinguished from the "variously non-whole articles" or others (e.g. empty capsules) different from the predetermined articles; at the same tie it is possible to count both the totality of the articles transiting through the detection zone 5 and, advantageously, the whole articles from among the totality.

In a more specific aspect, the present invention further comprises a directing section 11, arranged downstream of the thinning-out section 3, such that the objects that have transited through the directing section 11 fall into the directing section 11 which comprises deflector means (not illustrated as they can be of any type from among known types in the technical sector the invention belongs to), which direct the articles crossing them alternatively to the container 10 (in the illustrated example a bottle), if the articles 2 are whole, or to an outflow channel 9 if the articles 2 are not whole or of a different nature to the articles 2 (see FIG. 1). Note also that even if in FIG. 1 the articles directed to and introduced in the outflow channel 9 have a graphic appearance which is similar to the whole articles 2, directed to and introduced into the bottle 10, this is exclusively for the sake of simplicity in illustration, and in no way should it be interpreted in the sense that the whole articles 2 can be destined to end up in the outflow channel 9 or more in general, that the functioning of the apparatus 1 of the present invention is in an way different to what is described herein.

The objects deflected into the outflow channel 9 are destined, for example, to be placed in reject collection elements.

The deflector means can be connected to and controlled by the processing unit 8 which, by way of non-limiting example, calculates the number of whole articles 2 by difference, i.e. subtracting from the total number of objects that have passed through the detection zone 5 the number of non-whole articles 2 and the articles having a different nature from the articles 2.

The above is intended purely by way of non-limiting example, and any variants of a practical-applicational nature are understood to fall within the ambit of protection of the invention as described herein above and as set out in the following claims.

What is claimed:

1. A method for counting and validating discrete articles to be introduced into containers, comprising:

providing an apparatus for counting and validating discrete articles to be introduced into containers, the apparatus having a thinning-out section which receives the articles from supply means and distances the articles from one another, wherein the thinning-out section is such that each article crosses at least one detection zone which has electronic components including at least one variable reactance sensor, a reactance of which varies according to specific articles passing through the detection zone, the apparatus having at least one processing unit, connected to the variable reactance sensor in order to receive as an input, an output signal from the variable reactance sensor and to analyze a waveform of the output signal, the waveform being a function of the reactance variation, such that the processing unit outputs data relating to a number of the articles which have passed through the detection zone, including a state of wholeness of the articles and whether articles are of a different nature from other articles that have passed through the detection zone, the thinning-out section being a non-horizontal thinning-out support on which the articles freely descend as they are subject to a non-null force of gravity component; the detection zone being located in the thinning-out section, the at least one variable reactance sensor being a capacitive sensor, the electronic components being armatures of at least one condenser, the thinning-out support having a multiplicity of grooves which have a V-shaped transversal section, a surface of a concavity of which is covered with an electrically-insulating material, detection zones being located in a specific position along the grooves and being laterally defined by the armatures of the at least one condenser, the armatures being non-parallel to one another and being each located on a parallel plane to one of two planes on which surfaces for defining the concavity are located; and wherein the method further comprises the following stages:

a. distancing the articles from one another;

b. making each article of the articles pass through the at least one detection zone such as to induce a consequent reactance variation in the at least one variable reactance sensor, according to which reactance variation, an output signal of the variable reactance sensor takes on a specific waveform;

c. sending the output signal from the variable reactance sensor to the processing unit;

d. outputting from the processing unit, data including a number of the articles which have passed through the at least one detection zone, a state of wholeness of the articles as well as a passage of different nature articles through the at least one detection zone.

2. The method of claim 1, further comprising initial stages a', b' and c', respectively corresponding to actuation of stages a, b and c applied to a predetermined multiplicity of sample articles, which multiplicity comprises whole articles, various non-whole articles, and different nature articles, and wherein the method comprises a further stage of:

programming the processing unit such that once all signals relating to each sample article have been received, the processing unit subdivides respective waveforms into classes, on a basis of a predetermined function of similarity, specially associating the articles to the classes, to which articles stages a, b, c and d are successively applied in order to qualify the articles passing through the at least one detection zone either as whole articles or as non-whole articles or else as different nature articles.

3. An apparatus for counting and validating discrete articles to be introduced into containers comprising a thinning-out section which receives the articles from supply means and distances the articles from one another, wherein the thinning-out section is such that each article crosses at least one detection zone, which has electronic components including at least one variable reactance sensor, a reactance of which varies according to specific articles passing through the detection zone; the apparatus having at least one processing unit, connected to the variable reactance sensor in order to receive in input an output signal from the variable reactance sensor and to analyze a waveform of the output signal, which waveform is a function of the reactance variation, such that the processing unit outputs data relating to a number of the articles which have passed through the detection zone, a state of wholeness of the articles and whether articles of a different nature from other articles have passed through the detection zone;

the thinning-out section being a non-horizontal thinning-out support on which the articles freely descend, as the articles are subject to a non-null force of gravity component; the at least one detection zone being located in the thinning-out section; the at least one variable reactance sensor being a capacitive sensor and the electronic components are armatures of at least one condenser; the thinning-out support having a multiplicity of grooves which have a V-shaped transversal section, a surface of a concavity of which is covered with an electrically-insulating material, detection zones being located in specific positions along the grooves and being laterally defined by the armatures of the at least one condenser, the armatures being non-parallel to one another and being each located on a parallel plane to one of two planes on which surfaces for defining the concavity are located.

4. The apparatus of claim 3, wherein the thinning-out section causes each article to cross the detection zone singly.

5. The apparatus of claim 3, wherein the armatures of the condensers are located at the surfaces which define the concavity of the grooves and are covered by the electrically-insulating material.

6. The apparatus of claim 3, wherein the armatures of the condensers are located at a predetermined distance from the surfaces defining the concavity of the grooves, internally of the convex zone of the thinning-out support.

7. The apparatus of claim 3, wherein any longitudinal section of at least a portion of the thinning-out section is flat and inclined by about 30° with respect to an ideal horizontal plane crossing it.

8. The apparatus of claim 3, further comprising a directing section, arranged downstream of the thinning-out section, such that the transiting articles fall into the directing section, which has deflector means for directing the articles crossing the directing section alternatively to the container, if the articles are whole articles, or to an outflow channel, if the articles are non-whole articles or different nature articles.

9. The apparatus of claim 3, wherein the armatures of the condenser have a regular isosceles trapeze shape with a smallest base thereof positioned in proximity to a vertex of a respective groove.

* * * * *